United States Patent
Zeighami et al.

(10) Patent No.: US 7,533,303 B2
(45) Date of Patent: May 12, 2009

(54) METHOD AND SYSTEM FOR PERFORMING SYSTEM-LEVEL CORRECTION OF MEMORY ERRORS

(75) Inventors: Roy Mehdi Zeighami, McKinney, TX (US); Brian Matthew Johnson, Allen, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 546 days.

(21) Appl. No.: 11/107,034

(22) Filed: Apr. 15, 2005

(65) Prior Publication Data

US 2006/0236162 A1    Oct. 19, 2006

(51) Int. Cl.
*G06F 11/00* (2006.01)

(52) U.S. Cl. .......................... 714/47; 714/5

(58) Field of Classification Search .......... 714/5, 714/47, 708
See application file for complete search history.

(56) References Cited

U.S. PATENT DOCUMENTS

| | | | | |
|---|---|---|---|---|
| 4,638,427 A * | 1/1987 | Martin | | 703/23 |
| 5,058,115 A | 10/1991 | Blake et al. | | |
| 5,228,046 A | 7/1993 | Blake et al. | | |
| 5,313,625 A * | 5/1994 | Hess et al. | | 714/10 |
| 5,412,799 A * | 5/1995 | Papadopoulos | | 703/22 |
| 5,533,036 A | 7/1996 | Blake et al. | | |
| 5,682,394 A | 10/1997 | Blake et al. | | |
| 6,481,974 B2 * | 11/2002 | Horng et al. | | 417/42 |
| 6,489,912 B2 * | 12/2002 | Lamb et al. | | 341/155 |
| 6,515,917 B2 * | 2/2003 | Lamb et al. | | 365/189.09 |
| 6,662,136 B2 * | 12/2003 | Lamb et al. | | 702/132 |
| 6,702,665 B1 * | 3/2004 | Tai | | 454/256 |
| 6,757,857 B2 * | 6/2004 | Lamb et al. | | 714/740 |
| 6,874,108 B1 * | 3/2005 | Abramovici et al. | | 714/725 |
| 6,985,940 B1 * | 1/2006 | Jenkin | | 709/224 |
| 7,058,782 B2 * | 6/2006 | Henderson et al. | | 711/170 |
| 7,085,993 B2 * | 8/2006 | Goodnow et al. | | 714/798 |
| 7,100,004 B2 * | 8/2006 | Chen Johnson et al. | | 711/159 |
| 7,222,266 B2 * | 5/2007 | Wu et al. | | 714/39 |
| 2002/0099521 A1 * | 7/2002 | Yang et al. | | 702/186 |
| 2002/0110457 A1 * | 8/2002 | Horng et al. | | 417/42 |
| 2002/0145919 A1 * | 10/2002 | Lamb et al. | | 365/189.09 |
| 2002/0147564 A1 * | 10/2002 | Lamb et al. | | 702/132 |
| 2002/0147949 A1 * | 10/2002 | Lamb et al. | | 714/718 |
| 2002/0149972 A1 * | 10/2002 | Lamb et al. | | 365/189.09 |
| 2003/0037266 A1 * | 2/2003 | Karpel et al. | | 713/300 |
| 2003/0173830 A1 * | 9/2003 | Smith et al. | | 307/117 |
| 2004/0019844 A1 * | 1/2004 | Goodnow et al. | | 714/798 |
| 2005/0022065 A1 * | 1/2005 | Dixon et al. | | 714/42 |
| 2005/0107997 A1 * | 5/2005 | Watts et al. | | 703/21 |
| 2005/0160323 A1 * | 7/2005 | Wu et al. | | 714/39 |
| 2006/0010352 A1 * | 1/2006 | Mukherjee et al. | | 714/47 |
| 2006/0195755 A1 * | 8/2006 | Brown | | 714/754 |
| 2007/0101238 A1 * | 5/2007 | Resnick et al. | | 714/763 |

* cited by examiner

*Primary Examiner*—Robert Beausoliel
*Assistant Examiner*—Joshua P Lottich

(57) ABSTRACT

A method and system for correcting errors in a memory subsystem in a computer system. Occurrence of correctable memory errors are monitored and a determination is made whether the risk of an occurrence of an uncorrectable memory error is less than a tolerable risk. If the risk of an occurrence of an uncorrectable memory error is not less than the tolerable risk, at least one system level parameter is adjusted to decrease the occurrence of correctable memory errors.

27 Claims, 2 Drawing Sheets

METHOD AND SYSTEM FOR PERFORMING SYSTEM-LEVEL CORRECTION OF MEMORY ERRORS

BACKGROUND

It is common knowledge that Dynamic Random Access Memory ("DRAM") modules are comprised of capacitive electrical cells that leak their charge out over time. As a result, DRAM cells must be recharged, or "refreshed", thousands of times per second or they lose their data. Reading from or writing to a DRAM cell refreshes its charge, so a common way of refreshing a DRAM is to read periodically from each cell. This is typically accomplished by only activating each row using Row Address Strobe or RAS. In addition, a DRAM cell controller takes care of scheduling the refresh cycles and making sure that they don't interfere with regular reads and writes. So to keep the data in DRAM module from leaking away, the cell controller periodically sweeps through all of the rows by cycling RAS repeatedly and placing a series of row addresses on the address bus.

Even though the cell controller handles all the refreshes and tries to schedule them for maximum performance, having to go through and refresh each row every few milliseconds can interfere with the performance of reads and writes and thus have a serious negative impact on the performance of the DRAM modules. Clearly, it is beneficial to overall system performance to reduce the amount of time spent refreshing DRAM cells. As used herein, "system performance" takes into account factors including, but not limited to, data bandwidth, latency, overall system power consumption, acoustic noise, and others.

The number of refresh cycles required to refresh an entire DRAM module depends on the number of rows of DRAM cells in that module; the more rows, the greater the number of cycles required to refresh the entire module. Therefore, one manner in which to reduce the amount of time spent refreshing DRAM modules is to reduce the number of rows in the module.

Another manner in which to reduce the amount of time spent refreshing DRAM modules is to adjust the refresh rate; that is, the frequency with which the modules are refreshed. Commonly, there is a feature in the Basic I/O System ("BIOS") of a computer system that allows a user to set the refresh rate of the DRAM modules. In one embodiment, BIOS supports three different refresh rate settings, as well as an "AUTO" option. If the AUTO option is selected, the BIOS queries the DRAM modules and uses the lowest setting found for maximum compatibility. Optimizing the refresh rate is important, yet difficult. Refreshing too often negatively impacts system performance, as indicated above. In contrast, refreshing too infrequently can result in lost data due to an increase in errors, some of which may be of such a magnitude as to be uncorrectable.

Other system adjustments that can lessen the frequency or magnitude of DRAM errors include increasing the fan speed and migrating data from one memory module to another. Each adjustment, while positively impacting DRAM performance, has a corresponding negative effect on overall system performance. Accordingly, it would be beneficial only to make such adjustments when absolutely necessary.

SUMMARY

In One embodiment, a method of correcting errors in a memory subsystem in a computer system is disclosed. Occurrences of correctable memory errors are monitored and a determination is made whether a risk of the occurrence of an uncorrectable memory error is less than a tolerable risk. If the risk of an occurrence of an uncorrectable memory error is not less than the tolerable risk, at least one system level parameter is adjusted to decrease the occurrence of correctable memory errors.

DETAILED DESCRIPTION OF THE DRAWINGS

Figure 1:
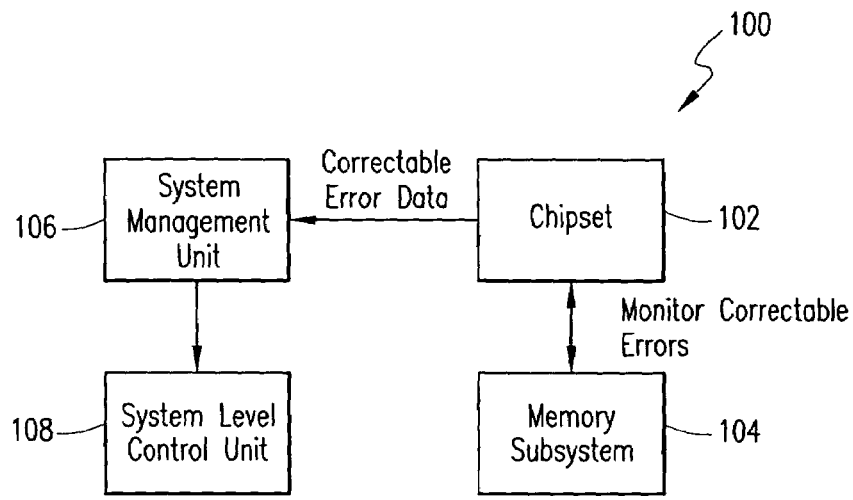
FIG. 1 is a block diagram of a portion of a computer system in accordance with one embodiment.

In the drawings, like or similar elements are designated with identical reference numerals throughout the several views thereof, and the various elements depicted are not necessarily drawn to scale.

It will be recognized that memory errors can be measured in terms of how often they occur (i.e, frequency) and in terms of the number of bits in error (i.e., magnitude). One embodiment recognizes that the likelihood of the occurrence of an uncorrectable error increases as the frequency and/or magnitude of correctable errors increase.

As such, in an embodiment described hereinbelow, the frequency and/or magnitude of correctable errors are monitored over a given window of time and, based on the results of the monitoring, system level adjustments are made to maintain the likelihood of the occurrence of an uncorrectable error below an acceptable threshold. Examples of such system level adjustments and the corresponding negative impact(s) on overall system performance of each include:

| Adjustment | Tradeoff |
| --- | --- |
| Increase the DRAM refresh rate | Reduced system performance |
| Increase the system fan speed | Increase in system power consumption and noise level |
| Migrate data to other, more reliable memory modules | Increase in complexity of the system |

As illustrated above, each system level adjustment carries with it some undesirable cost; therefore, it is prudent to make such adjustments only when absolutely necessary. An embodiment described herein facilitates that goal.

FIG. 1 is a block diagram of a portion of a computer system 100 for implementing an embodiment of a method and system for performing system-level correction of memory errors. As illustrated in FIG. 1, the computer system 100 comprises a chipset 102 including but not limited to a collection of integrated circuits for monitoring and collecting data regarding correctable errors experienced by the memory subsystem 104. It will be recognized that in one embodiment, the memory subsystem 104 may comprise a plurality of DRAM modules each comprising DRAM cells, each cell for storing a bit of data. As previously discussed, in order to retain their charge and thus retain the data held therein, each cell must be refreshed from time to time in a known manner.

The system 100 further comprises a system management unit ("SMU") 106 for receiving from the chipset 102 data regarding correctable errors experienced by the memory subsystem 104. As will be described in greater detail with reference to FIG. 2, the SMU 106 processes the correctable error data from the chipset 102 and instructs a system level control unit 108 to make the appropriate system level adjustments based on the processing.

Figure 2:
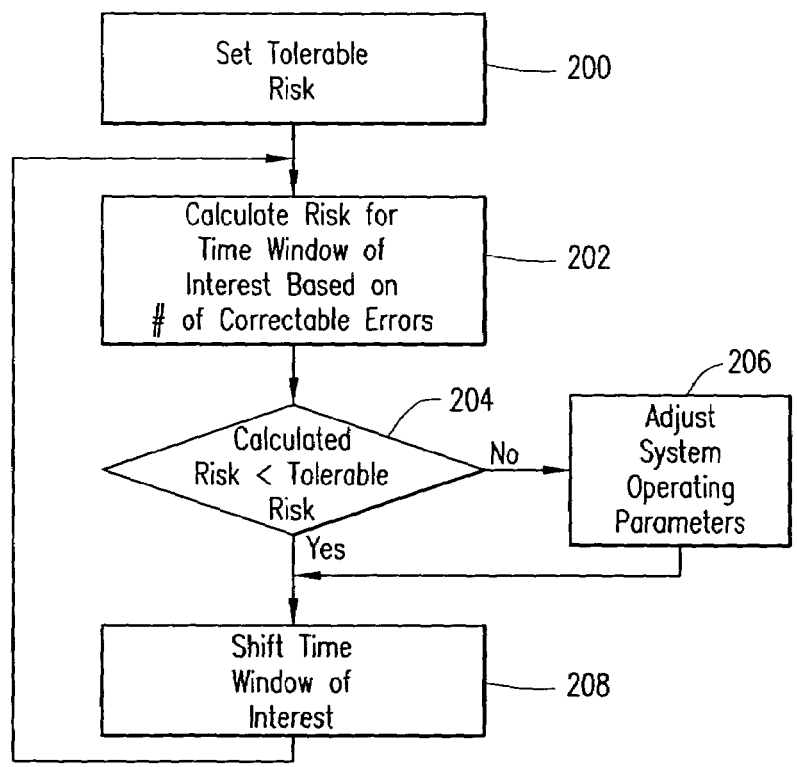
FIG. 2 is a flowchart of the operation of the embodiment illustrated in FIG. 1.

FIG. 2 is a flowchart illustrating operation of the SMU 106 in accordance with one embodiment. As used herein, the term "risk" is defined as the possibility that an uncorredtable error will occur within a given window of time. Mathematically, risk R is a function of the number and magnitude (i.e., from one bit up to n bits) of correctable errors that occur during the window of time. It will be recognized that, in normal operation, it generally takes a larger number of smaller magnitude (e.g., one-bit) correctable errors to pose a risk equivalent to that posed by a single larger magnitude (e.g., n-bit) error. As a result, in calculating R, higher degree (or greater magnitude) correctable errors are weighted more heavily (e.g., several orders of magnitude) than lower degree (or lesser magnitude) correctable errors.

The term "tolerable risk" is defined as the amount of risk that will be tolerated before system level adjustments will be made by the SMU 106. In block 200, the tolerable risk is set to some level determined to result in optimum system performance while minimizing the probability that an uncorrectable error will occur. It will be recognized that the level of risk that is tolerable will be dependent upon the particulars of a given system and the environment in which the system is used.

Figure 3:
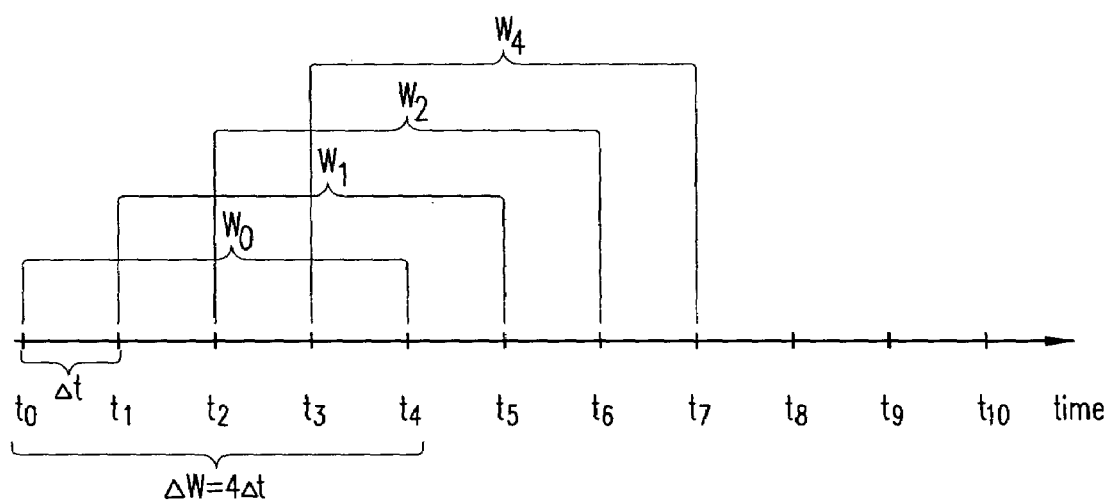
FIG. 3 illustrates time windows in which correctable memory errors are monitored in accordance with one embodiment.

In block 202, the SMU 106 calculates the risk of occurrence of an uncorrectable memory error for a time window of interest based on the correctable error data received from the chipset 102. For example, assuming $\Delta W$ represents the size of the window of interest, $\Delta t$ represents the size of a time shift, and $t_0$ represents an initial point in time, at a time $t_n = t_0 + n\Delta t$, the SMU 106 will calculate the risk R for a time window $W_n$ extending from time $t_n$ to time $t_n + \Delta W$. This concept is illustrated in FIG. 3, where $\Delta W$ is equal to $4\Delta t$ and a time window $W_0$ extends from time t0 to time t4, a time window $W_1$ extends from time t1 to time t5, a time window $W_2$ extends from time t2 to time t6, and so on.

In block 204, a determination is made whether the risk calculated in block 202 is less than the tolerable risk. If not, execution proceeds to block 206, in which the SMU 106 instructs the system level control unit 108 to adjust one or more of various system operating parameters to decrease the risk. Examples of parameters that could be adjusted include fan speed, refresh rate, clock frequency, power consumption, transaction mix, and migration of data to other memory modules, to name a few. It will be recognized that any number of combinations of system parameter adjustments may be performed in order to decrease the magnitude and/or frequency of correctable memory (e.g., DRAM) errors and thereby decrease the risk that an uncorrectable error will occur. Upon completion of the adjustments in block 206, execution proceeds to block 208. If a positive determination is made in block 204, execution proceeds directly to block 208. In block 208, the time window of interest is shifted by $\Delta t$ and execution returns to block 202.

Those skilled in the art should appreciate the embodiments described herein capitalize on the realization that uncorrectable errors become more likely as the frequency of correctable errors increases. As such, the exemplary embodiments provide for monitoring of the rate at which correctable errors occur and, based on this information, system level adjustments may be made which keep the likelihood of uncorrectable errors within acceptable ranges. Furthermore, this loop of measurements and corrections may be carried out continuously for each system in order to maintain continuous optimal operation.

It will be noted that an embodiment as described with reference to FIGS. 1 and 2 results in a feedback loop whereby data characterizing the occurrence of correctable memory errors is processed and, responsive to the processing, action is taken with regard to system parameters, thereby to positively impact the occurrence of correctable memory errors, the effect of which is monitored and used to perform further system parameter adjustments, and so on.

It will be further noted that monitoring of the magnitude and frequency of correctable errors directly, as opposed to indirect monitoring thereof through monitoring of system conditions that may result in such errors, will decrease the likelihood that unnecessary system level adjustments, with their attendant negative consequences, will be made.

It will also be recognized that although the chipset 102 and SMU 106 are illustrated as comprising separate elements, the functionality thereof could be implemented as a single element. Moreover, the functionality of the chipset 102 and SMU 106 could be implemented as more than two elements where desired.

An implementation of the invention described herein thus provides method and system for performing system-level correction of memory, in particular, DRAM, errors in a computer system. Not only is the performance of a computer system under normal operations ensured to be optimized, the teachings set forth herein allow the system level adjustments to be made to the computer system only when necessary to reduce the risk of occurrence of an incorrectable memory error. Accordingly, the embodiments of the present patent application help avoid the high costs associated with overdesign of environmental infrastructure associated with a computer system.

The embodiments shown and described have been characterized as being illustrative only; it should therefore be readily understood that various changes and modifications could be made therein without departing from the scope of the present invention as set forth in the following claims.

What is claimed is:

1. A method of correcting errors in a memory subsystem in a computer system, the method comprising:
   monitoring occurrence of correctable memory errors;
   responsive to the monitoring, determining whether a risk of the occurrence of an uncorrectable memory error is less than a tolerable risk; and
   responsive to a determination that the risk of the occurrence of an uncorrectable memory error is not less than a tolerable risk, adjusting at least one system level parameter to decrease the occurrence of correctable memory errors, wherein the at least one system level parameter comprises adjusting a transaction mix.

2. The method of claim 1 wherein the adjusting at least one system level parameter to decrease the occurrence of correctable memory errors also decreases the risk of the occurrence of an uncorrectable memory error.

3. The method of claim 1 wherein the determining comprises:
   determining the risk that an uncorrectable memory error will occur based on information regarding the correctable memory errors that have occurred as detected by the monitoring; and
   comparing the determined risk to the tolerable risk.

4. The method of claim 3 wherein the information regarding the correctable memory errors includes a magnitude of each of the correctable memory errors.

5. The method of claim 4 wherein the magnitude of a correctable memory error is measured by the number of bits in error.

6. The method of claim 3 wherein the information regarding the correctable memory errors includes a frequency with which the correctable memory errors occur.

7. The method of claim 1 wherein the monitoring is performed for a discrete window of time.

8. A system for correcting errors in a memory subsystem in a computer, the system comprising:
   means for monitoring occurrence of correctable memory errors;

means responsive to the monitoring for determining whether a risk of occurrence of an uncorrectable memory error is less than a tolerable risk; and means responsive to a determination that the risk of the occurrence of an uncorrectable memory error is not less than a tolerable risk for adjusting at least one system level parameter to decrease the occurrence of correctable memory errors, wherein the at least one system level parameter comprises adjusting a transaction mix.

9. The system of claim 8 wherein the means for adjusting at least one system level parameter to decrease the occurrence of correctable memory errors also decreases the risk of occurrence of an uncorrectable memory error.

10. The system of claim 8 wherein the means for determining comprises:

means for determining the risk that an uncorrectable memory error will occur based on information regarding the correctable memory errors that have occurred as detected by the monitoring means; and means for comparing the determined risk to the tolerable risk.

11. The system of claim 10 wherein the information regarding the correctable memory errors includes a magnitude of each of the correctable memory errors.

12. The system of claim 11 wherein the magnitude of a correctable memory error is measured by the number of bits in error.

13. The system of claim 10 wherein the information regarding the correctable memory errors includes a frequency with which the correctable memory errors occur.

14. The system of claim 8 wherein the monitoring is performed for a discrete window of time.

15. A system for correcting errors in a memory subsystem in a computer, the system comprising:

a chipset for monitoring occurrence of correctable errors in the memory subsystem;

a system management unit ("SMU") responsive to the monitoring for determining whether a risk of occurrence of an uncorrectable memory error is less than a tolerable risk; and a system level control unit responsive to a determination by the SMU that the risk of occurrence of an uncorrectable memory error is not less than a tolerable risk for adjusting at least one system level parameter to decrease the occurrence of correctable memory errors, wherein the at least one system level parameter comprises adjusting a transaction mix.

16. The system of claim 15 wherein the adjustment by the system level control unit of at least one system level parameter also decreases the risk of occurrence of an uncorrectable memory error.

17. The system of claim 15 wherein the SMU comprises:

logic for determining the risk that an uncorrectable memory error will occur based on information regarding the correctable memory errors that have occurred as detected by the chipset; and logic for comparing the determined risk to the tolerable risk.

18. The system of claim 17 wherein the information regarding the correctable memory errors includes a magnitude of each of the correctable memory errors.

19. The system of claim 18 wherein the magnitude of a correctable memory error is measured by the number of bits in error.

20. The system of claim 17 wherein the information regarding the correctable memory errors includes a frequency with which the correctable memory errors occur.

21. The system of claim 15 wherein the chipset performs the monitoring for a discrete window of time.

22. A computer-readable medium operable with a computer for correcting errors in a memory subsystem of the computer, the medium having stored thereon:

instructions executable by the computer for monitoring the occurrence of correctable DRAM errors;

instructions executable by the computer responsive to the monitoring for determining whether a risk of occurrence of an uncorrectable DRAM error is less than a tolerable risk; and instructions executable by the computer responsive to a determination that the risk of occurrence of an uncorrectable DRAM error is not less than a tolerable risk for adjusting at least one system level parameter to decrease the occurrence of correctable DRAM errors, wherein the at least one system level parameter comprises adjusting a transaction mix.

23. The computer-readable medium of claim 22 wherein the instructions executable by the computer for adjusting at least one system level parameter to decrease the occurrence of correctable DRAM errors also decreases the risk of occurrence of an uncorrectable DRAM error.

24. The computer-readable medium of claim 22 wherein the instructions for determining whether a risk of the occurrence of an uncorrectable DRAM error is less than a tolerable risk comprise:

instructions executable by the computer for determining the risk that an uncorrectable DRAM error will occur based on information regarding the correctable DRAM errors that have occurred; and instructions executable by the computer for comparing the determined risk to the tolerable risk.

25. A computer-readable medium on which is stored a computer program product operable with a computer for correcting errors in a memory subsystem of the computer, the computer-readable medium comprising:

program code for monitoring the occurrence of correctable DRAM errors;

program code responsive to the monitoring for determining whether a risk of the occurrence of an uncorrectable DRAM error is less than a tolerable risk; and program code responsive to a determination that the risk of the occurrence of an uncorrectable DRAM error is not less than a tolerable risk for adjusting at least one system level parameter to decrease the occurrence of correctable DRAM errors, wherein the at least one system level parameter comprises adjusting a transaction mix.

26. The computer-readable medium of claim 25 wherein the program code for adjusting at least one system level parameter to decrease the occurrence of correctable DRAM errors further comprises program code for decreasing the risk of the occurrence of an uncorrectable DRAM error.

27. The computer-readable medium of claim 25 wherein the program code for determining whether a risk of the occurrence of an uncorrectable DRAM error is less than a tolerable risk comprises:

program code for determining the risk that an uncorrectable DRAM error will occur based on information regarding the correctable DRAM errors that have occurred; and program code for comparing the determined risk to the tolerable risk.

* * * * *

UNITED STATES PATENT AND TRADEMARK OFFICE
CERTIFICATE OF CORRECTION

PATENT NO. : 7,533,303 B2
APPLICATION NO. : 11/107034
DATED : May 12, 2009
INVENTOR(S) : Roy Mehdi Zeighami et al.

It is certified that error appears in the above-identified patent and that said Letters Patent is hereby corrected as shown below:

On the title page, in field (57), under "ABSTRACT", in column 2, line 2, delete "Occurrence" and insert -- Occurrences --, therefor.

In column 3, line 3, delete "uncorredtable" and insert -- uncorrectable --, therefor.

In column 4, line 32, in Claim 1, after "monitoring" insert -- the --.

In column 4, line 66, in Claim 8, after "monitoring" insert -- the --.

In column 5, line 2, in Claim 8, before "occurrence" insert -- the --.

In column 5, line 12, in Claim 9, after "risk of" insert -- the --.

In column 5, line 35, in Claim 15, after "monitoring" insert -- the --.

In column 5, line 38, in Claim 15, after "risk of" insert -- the --.

In column 5, line 42, in Claim 15, after "risk of" insert -- the --.

In column 5, line 50, in Claim 16, after "risk of" insert -- the --.

In column 6, line 9, in Claim 22, after "risk of" insert -- the --.

In column 6, line 13, in Claim 22, after "risk of" insert -- the --.

UNITED STATES PATENT AND TRADEMARK OFFICE
CERTIFICATE OF CORRECTION

PATENT NO.       : 7,533,303 B2
APPLICATION NO.  : 11/107034
DATED            : May 12, 2009
INVENTOR(S)      : Roy Mehdi Zeighami et al.

It is certified that error appears in the above-identified patent and that said Letters Patent is hereby corrected as shown below:

In column 6, line 23, in Claim 23, after "risk of" insert -- the --.

Signed and Sealed this

Fifteenth Day of September, 2009

David J. Kappos
*Director of the United States Patent and Trademark Office*